(12) United States Patent
Wang et al.

(10) Patent No.: US 8,545,715 B1
(45) Date of Patent: Oct. 1, 2013

(54) CHEMICAL MECHANICAL POLISHING COMPOSITION AND METHOD

(71) Applicant: Rohm and Haas Electronic Materials CMP Holdings, Inc., Newark, DE (US)

(72) Inventors: Hongyu Wang, Wilmington, DE (US); David Mosley, Philadelphia, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 13/647,941

(22) Filed: Oct. 9, 2012

(51) Int. Cl.
*C09K 13/04* (2006.01)

(52) U.S. Cl.
USPC ............................. 252/79.2; 216/89; 438/693

(58) Field of Classification Search
USPC .................. 252/79.2, 79.1; 216/89; 438/693
See application file for complete search history.

(56) References Cited

U.S. PATENT DOCUMENTS

| 6,626,968 | B2 | 9/2003 | Park et al. |
| 7,785,487 | B2 * | 8/2010 | Thomas et al. ................. 252/79 |
| 7,842,192 | B2 | 11/2010 | Bian et al. |
| 2004/0082274 | A1 | 4/2004 | Leng |
| 2011/0165777 | A1 | 7/2011 | Siddiqui et al. |
| 2012/0070990 | A1 | 3/2012 | Liu et al. |
| 2012/0225556 | A1 | 9/2012 | Lakrout et al. |

* cited by examiner

*Primary Examiner* — Roberts Culbert
(74) *Attorney, Agent, or Firm* — Thomas S. Deibert

(57) ABSTRACT

A chemical mechanical polishing composition and method is provided, wherein the low-k dielectric material removal rate remains stable following the polishing of a $110^{th}$ polished wafer in a plurality of wafers to be polished.

9 Claims, No Drawings

CHEMICAL MECHANICAL POLISHING COMPOSITION AND METHOD

The present invention relates generally to the field of chemical mechanical polishing. In particular, the present invention is directed to a chemical mechanical polishing composition and method for polishing semiconductor wafers, wherein the low-k dielectric material removal rate remains stable following the polishing of a $110^{th}$ polished wafer in a plurality of wafers to be polished for the lifetime of a given polishing pad.

The semiconductor industry is increasingly relying on copper electrical interconnects in the manufacture of integrated circuits. A typical process for the manufacture of integrated circuits uses copper in a damascene type structure. During this manufacturing process, a substantial excess of copper is typically deposited on the surface of a wafer. Generally, a multi-step copper process is employed that involves an initial removal and planarization step, wherein chemical mechanical planarization is used to remove the copper overburden (i.e., step 1 copper CMP process) followed by a barrier layer CMP process (i.e., step 2 CMP process). During the step 1 copper CMP process, the only material that is actively exposed to CMP process is copper. Accordingly, manufacturers typically utilize a copper slurry that exhibits a high copper removal rate for the step 1 copper CMP process. During the step 2 CMP process; however, other materials in addition to copper are present or become present at the substrate surface actively exposed to the CMP process. Accordingly, manufactures use barrier slurries for the step 2 CMP process.

Due to different integrated circuit chip designs and manufacturing processes, different manufacturers have different removal rate requirements for the barrier slurries used in step 2. That is, there are a large number of materials manufactures use in the production of integrated circuits (i.e., semiconductor wafers). Typically; however, three types of materials are present during the step 2 CMP process, namely: conductive layer materials (e.g., copper); adhesion/barrier layer materials (e.g., tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides); and, dielectric materials (e.g., TEOS and a low-k materials such as carbon doped oxides). Accordingly, given the multiple materials actively exposed to the CMP process during step 2, it is important to employ a barrier slurry having a properly tailored combination of removal rates and removal rate selectivities to provide the desired polishing results.

One polishing composition for use in a step 2 CMP process for removing barrier materials in the presence of interconnect metals and dielectrics is disclosed in U.S. Pat. No. 7,300,602 to Liu et al. Liu et al. disclose a polishing solution useful for removing barrier materials in the presence of interconnect metals and dielectrics comprising 0.1 to 10 weight percent hydrogen peroxide, at least one pH adjusting agent selected from the group consisting of nitric acid, sulfuric acid, hydrochloric acid and phosphoric acid for adjusting a pH level of the polishing solution to less than 3, 0.25 to 1.7 weight percent benzotriazole inhibitor for reducing removal rate of the interconnect metals, 0 to 10 weight percent surfactant, 0.01 to 10 weight percent colloidal silica having an average particle size of less than 50 nm and balance water and incidental impurities, and the polishing solution has a tantalum nitride to copper selectivity of at least 3 to 1 and a tantalum nitride to TEOS selectivity of at least 3 to 1 as measured with a polishing pad pressure measured normal to a wafer less than 15 kPa.

Notwithstanding, there remains a continuing need for additional chemical mechanical polishing compositions for use in step 2 CMP processes capable of selectively removing barrier materials relative to interconnect metals and dielectric materials, including low-k dielectric materials.

The present invention provides a chemical mechanical polishing composition, consisting essentially of, as initial components: water; 0.01 to 0.5 wt % of an azole inhibitor, wherein the azole inhibitor is selected from the group consisting of benzotriazole (BTA), mercaptobenzotriazole (MBT), tolytriazole (TTA), imidazole and combinations thereof; 0.01 to 0.5 wt % of a complexing agent, wherein the complexing agent is selected from the group consisting of citric acid, lactic acid, malic acid, maleic acid, malonic acid, oxalic acid, tartaric acid and gluconic acid; 0 to 1.0 wt % of an ammonium halide, wherein the ammonium halide is selected from the group consisting of ammonium chloride, ammonium bromide and ammonium fluoride; 0.01 to 1 wt % of a phosphorus containing agent, wherein the phosphorus containing agent is phosphoric acid; 0.05 to 1.0 wt % of a hydrotrope, wherein the hydrotrope is selected from the group consisting of benzene sulfonate, $C_{1-4}$ alkylbenzene sulfonates, di-$C_{1-4}$ alkylbenzene sulfonates, $C_{5-10}$ alkane sulfonate and salts thereof; 0.1 to 40 wt % of a colloidal silica abrasive; 0 to 5.0 wt % of an oxidizer; 0.005 to 1.0 wt % of a polyvinyl alkyl ether; 0 to 0.01 wt % of a biocide, wherein the biocide is a thiazoline derivative; and, a pH adjusting agent; wherein the chemical mechanical polishing composition has a designed for polishing pH of 8 to 12; and, wherein the chemical mechanical polishing composition exhibits a stable manufacturing low-k dielectric material removal rate.

The present invention provides a chemical mechanical polishing composition, consisting essentially of, as initial components: water; 0.02 to 0.04 wt % of an azole inhibitor, wherein the azole inhibitor is benzotriazole; 0.1 to 0.4 wt % of a complexing agent, wherein the complexing agent is citric acid; 0.1 to 0.3 wt % of an ammonium halide, wherein the ammonium halide is ammonium chloride; 0.05 to 0.1 wt % of a phosphorus containing agent, wherein the phosphorus containing agent is phosphoric acid; 0.3 to 0.8 wt % of a hydrotrope, wherein the hydrotrope is according to the following formula:

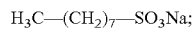

20 to 30 wt % of a colloidal silica abrasive, wherein the colloidal silica has an average particle size of ≤100 nm; 0.1 to 0.5 wt % of an oxidizer, wherein the oxidizer is $H_2O_2$; 0.008 to 0.03 wt % of a polyvinyl alkyl ether; and, 0.001 to 0.009 wt % of a biocide, wherein the biocide is a thiazoline derivative; wherein the chemical mechanical polishing composition has a designed for polishing pH of 8 to 12; and, wherein the chemical mechanical polishing composition exhibits a stable manufacturing low-k dielectric material removal rate.

The present invention provides a method for chemical mechanical polishing of a plurality of substrates, comprising: providing at least 150 separate semiconductor wafer substrates having a surface to be polished, wherein the surface to be polished comprises a low-k dielectric material; providing a chemical mechanical polishing pad, wherein the chemical mechanical polishing pad comprises a polyurethane; providing a chemical mechanical polishing composition, wherein the chemical mechanical polishing composition consists essentially of, as initial components: water; 0.01 to 0.5 wt % of the azole inhibitor, wherein the azole inhibitor is selected from the group consisting of benzotriazole (BTA), mercaptobenzotriazole (MBT), tolytriazole (TTA), imidazole and combinations thereof; 0.01 to 0.5 wt % of the complexing agent, wherein the complexing agent is selected from the group consisting of citric acid, lactic acid, malic acid, maleic acid, malonic acid, oxalic acid, tartaric acid and gluconic acid; 0 to 1.0 wt % of the ammonium halide, wherein the ammonium halide is selected from the group consisting of ammonium chloride, ammonium bromide and ammonium fluoride; 0.01 to 1 wt % of the phosphorus containing agent, wherein the phosphorus containing agent is phosphoric acid; 0.05 to 1.0 wt % of the hydrotrope, wherein the hydrotrope is selected from the group consisting of benzene sulfonate, $C_{1-4}$ alkylbenzene sulfonates, di-$C_{1-4}$ alkylbenzene sulfonates, $C_{5-10}$ alkane sulfonate and salts thereof; 0.1 to 40 wt % of the colloidal silica abrasive; 0 to 5.0 wt % of the oxidizer; 0.005 to 1.0 wt % of the polyvinyl alkyl ether; 0 to 0.01 wt % of the biocide, wherein the biocide is a thiazoline derivative; and, a pH adjusting agent; wherein the chemical mechanical polishing composition has a pH of 8 to 12; consecutively creating dynamic contact at an interface between the chemical mechanical polishing pad and each one of the at least 150 separate semiconductor wafer substrates; and dispensing the chemical mechanical polishing composition onto the chemical mechanical polishing pad at or near the interface between the chemical mechanical polishing pad and each one of the at least 150 separate semiconductor wafer substrates to facilitate polishing of the surface to be polished of each one of the at least 150 separate semiconductor wafer substrates to provide at least 150 polished wafers; wherein at least some of the low-k dielectric material is removed from the surface to be polished of each one of the at least 150 separate semiconductor wafer substrates to provide the at least 150 polished wafers; wherein the rate at which the low-k dielectric material is removed from the surface to be polished of each one of the at least 150 separate semiconductor wafer substrates to provide the at least 150 polished wafers defines a low-k dielectric material removal rate for each one of the at least 150 polished wafers; wherein the low-k dielectric material removal rates for the at least 150 polished wafers initially decays in magnitude from a first polished wafer in the at least 150 polished wafers to each subsequently polished wafer in the at least 150 polished wafers up until a transition point polished wafer in the at least 150 polished wafers for which the associated low-k dielectric material removal rate is higher than the associated low-k dielectric material removal rate for a last previously polished wafer in the at least 150 polished wafers; wherein the transition point polished wafer is polished before a $100^{th}$ polished wafer in the at least 150 polished wafers is polished; and, wherein the low-k dielectric material removal rates associated with the at least 150 polished wafers remains stable following the polishing of the surface to be polished of a $110^{th}$ polished wafer in the at least 150 polished wafers.

The present invention provides a method for chemical mechanical polishing of a plurality of substrates, comprising: providing at least 150 separate semiconductor wafer substrates having a surface to be polished, wherein the surface to be polished comprises a low-k dielectric material; providing a chemical mechanical polishing pad, wherein the chemical mechanical polishing pad comprises a polyurethane; providing a chemical mechanical polishing composition, wherein the chemical mechanical polishing composition consists essentially of, as initial components: water; 0.02 to 0.04 wt % of an azole inhibitor, wherein the azole inhibitor is benzotriazole; 0.1 to 0.4 wt % of a complexing agent, wherein the complexing agent is citric acid; 0.1 to 0.3 wt % of an ammonium halide, wherein the ammonium halide is ammonium chloride; 0.05 to 0.1 wt % of a phosphorus containing agent, wherein the phosphorus containing agent is phosphoric acid; 0.3 to 0.8 wt % of a hydrotrope, wherein the hydrotrope is according to the following formula:

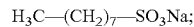

$H_3C-(CH_2)_7-SO_3Na$;

20 to 30 wt % of a colloidal silica abrasive, wherein the colloidal silica has an average particle size of ≤100 nm; 0.1 to 0.5 wt % of an oxidizer, wherein the oxidizer is $H_2O_2$; 0.008 to 0.03 wt % of a polyvinyl alkyl ether; and, 0.001 to 0.009 wt % of a biocide, wherein the biocide is a thiazoline derivative; and, a pH adjusting agent; wherein the chemical mechanical polishing composition has a pH of 8 to 12; consecutively creating dynamic contact at an interface between the chemical mechanical polishing pad and each one of the at least 150 separate semiconductor wafer substrates; and dispensing the chemical mechanical polishing composition onto the chemical mechanical polishing pad at or near the interface between the chemical mechanical polishing pad and each one of the at least 150 separate semiconductor wafer substrates to facilitate polishing of the surface to be polished of each one of the at least 150 separate semiconductor wafer substrates to provide at least 150 polished wafers; wherein at least some of the low-k dielectric material is removed from the surface to be polished of each one of the at least 150 separate semiconductor wafer substrates to provide the at least 150 polished wafers; wherein the rate at which the low-k dielectric material is removed from the surface to be polished of each one of the at least 150 separate semiconductor wafer substrates to provide the at least 150 polished wafers defines a low-k dielectric material removal rate for each one of the at least 150 polished wafers; wherein the low-k dielectric material removal rates for the at least 150 polished wafers initially decays in magnitude from a first polished wafer in the at least 150 polished wafers to each subsequently polished wafer in the at least 150 polished wafers up until a transition point polished wafer in the at least 150 polished wafers for which the associated low-k dielectric material removal rate is higher than the associated low-k dielectric material removal rate for a last previously polished wafer in the at least 150 polished wafers; wherein the transition point polished wafer is polished before a $100^{th}$ polished wafer in the at least 150 polished wafers is polished; and, wherein the low-k dielectric material removal rates associated with the at least 150 polished wafers remains stable following the polishing of the surface to be polished of a $110^{th}$ polished wafer in the at least 150 polished wafers.

DETAILED DESCRIPTION

Typically, wafer manufacturers prefer to use barrier polishing slurry formulations that exhibit a low-k dielectric material removal rate of less than 1,000 Å/min (as measured under the conditions set forth in the Examples). Barrier polishing slurry formulations that satisfy other removal rate requirements for a given step 2 CMP process also exhibit an undesirably high low-k dielectric material removal rate. It has been suggested that one way of achieving the desired low-k dielectric material removal rate without affecting the removal rate of the other layers present during the step 2 CMP process (e.g., TEOS), is to incorporate a polyvinyl alkyl ether into the barrier polishing slurry. Unfortunately, the simple addition of a polyvinyl alkyl ether to a given barrier polishing slurry results in a polishing formulation that exhibits an unstable low-k material removal rate. Specifically, the low-k material removal rate diminishes with polishing such that the low-k material removal rate for each successive wafer polished is lower than the low-k material removal rate for the previously polished wafer.

We have surprisingly found that the polyvinyl alkyl ether undesirably interacts with the polishing surface of polyurethane polishing pads used in typical step 2 CMP processes. We have found that it is this interaction between the polyvinyl alkyl ether and the polishing surface of the polishing pad that results in the undesirable decay in the low-k material removal rate over time with the polishing of multiple successive wafers. Conventional polishing pad conditioning techniques are not adequate to restore the polishing surface of the polishing pad to a condition that facilitates a stable low-k material removal rate over the useful lifetime of the polishing pad (e.g., 1,000 wafers).

It has also surprisingly been found that the incorporation into a polyvinyl alkyl ether containing alkaline, barrier polishing formulation of a hydrotrope selected from the group consisting of benzene sulfonate, $C_{1-4}$ alkylbenzene sulfonates (e.g., toluene sulfonate, cumene sulfonate), di-$C_{1-4}$ alkylbenzene sulfonates (e.g., xylene sulfonate, cymene sulfonate), $C_{5-10}$ alkane sulfonate and salts thereof alters the interaction between the polishing surface of the polishing pad and polyvinyl alkyl ether such that the resulting chemical mechanical polishing composition exhibits a stable manufacturing low-k dielectric material removal rate.

The term "stable manufacturing low-k dielectric material removal rate" as used herein and in the appended claims means that the low-k dielectric material removal rate associated with consecutively polished semiconductor wafer substrates that are polished using a chemical mechanical polishing composition of the present invention in combination with a chemical mechanical polishing pad varies by less than 12% from the low-k dielectric material removal rate associated with a $110^{th}$ consecutively polished semiconductor wafer substrate for all consecutively polished semiconductor wafer substrates polished subsequent to the $110^{th}$ consecutively polished semiconductor wafer substrate for the remaining life of the chemical mechanical polishing pad.

The chemical mechanical polishing composition of the present invention preferably contains, as an initial component, an azole inhibitor to tune the removal of nonferrous metal (e.g., copper) interconnects by static etch or other removal mechanism. Adjusting the concentration of the inhibitor adjusts the interconnect metal removal rate by protecting the metal from static etch. Preferably, the chemical mechanical polishing composition contains 0.01 to 0.5 wt %, more preferably 0.01 to 0.1 wt %, most preferably 0.02 to 0.04 wt % of an azole inhibitor. More preferably, the azole inhibitor is selected from the group consisting of benzotriazole (BTA), mercaptobenzotriazole (MBT), tolytriazole (TTA), imidazole and combinations thereof. Combinations of azole inhibitors can increase or decrease the copper removal rate. Most preferably, the inhibitor is BTA, which is a particularly effective inhibitor for copper and silver interconnects. Optionally, the inhibitor comprises a mixture of azole inhibitors.

The chemical mechanical polishing composition of the present invention preferably contains, as an initial component, a complexing agent for the non-ferrous metal. Preferably, the chemical mechanical polishing composition contains, as an initial component, 0.01 to 1.0 wt % (more preferably 0.01 to 0.5 wt %, most preferably 0.1 to 0.4 wt %) of a complexing agent selected from the group consisting of citric acid, lactic acid, malic acid, maleic acid, malonic acid, oxalic acid, tartaric acid and gluconic acid. Preferably, the complexing agent is selected from the group consisting of citric acid, lactic acid, malic acid and maleic acid. Most preferably the complexing agent is citric acid.

The chemical mechanical polishing composition of the present invention preferably contains, as an initial component, an ammonium halide. Preferably, the chemical mechanical polishing composition contains, as an initial component, 0 to 0.1 wt % (more preferably 0.01 to 0.05 wt %, most preferably 0.1 to 0.03 wt %) of an ammonium halide selected from the group consisting of ammonium chloride, ammonium bromide and ammonium fluoride. Most preferably, the ammonium halide is ammonium chloride.

The chemical mechanical polishing composition of the present invention preferably contains, as an initial component, a phosphorus containing agent. Preferably, the chemical mechanical polishing composition comprises 0.01 to 1.0 wt % (more preferably 0.01 to 0.1 wt %; most preferably 0.05 to 0.1 wt %) of a phosphorus containing agent, wherein the phosphorus containing agent is phosphoric acid.

The chemical mechanical polishing composition of the present invention preferably contains, as an initial component, a hydrotrope selected from the group consisting of benzene sulfonate, $C_{1-4}$ alkylbenzene sulfonates (e.g., toluene sulfonate, cumene sulfonate), di-$C_{1-4}$ alkylbenzene sulfonates (e.g., xylene sulfonate, cymene sulfonate), $C_{5-10}$ alkane sulfonate and salts thereof. Preferably, the chemical mechanical polishing composition contains, as an initial component, 0.05 to 1 wt % (more preferably 0.1 to 1 wt %, most preferably 0.3 to 0.8 wt % of a hydrotrope. Preferably, the hydrotrope is selected from the group consisting of sodium toluene sulfonate, sodium xylene sulfonate and sodium $C_{5-10}$ alkane sulfonate. Most preferably, the hydrotrope is according to the following formula:

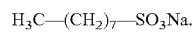

$$H_3C-(CH_2)_7-SO_3Na.$$

The chemical mechanical polishing composition of the present invention preferably contains, as an initial component, 0.1 to 40 wt % of a colloidal silica abrasive. More preferably, the chemical mechanical polishing composition of the present invention contains, as an initial component, 5 to 30 wt % (most preferably 20 to 30 wt %) of a colloidal silica abrasive. The colloidal silica abrasive used preferably has an average particle size of ≤100 nm (more preferably 10 to 100 nm; most preferably 25 to 60 nm).

The chemical mechanical polishing composition of the present invention optionally contains, as an initial component, an oxidizer. The chemical mechanical polishing composition preferably contains, as an initial component, 0 to 5 wt % (more preferably 0.1 to 5 wt %, still more preferably 0.1 to 1.0 wt %, most preferably 0.1 to 0.5 wt %) of an oxidizer. Preferably, the oxidizer is selected from hydrogen peroxide $(H_2O_2)$, monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizer is hydrogen peroxide. When the chemical mechanical polishing composition is formulated to contain an unstable oxidizing agent such as, hydrogen peroxide, it is preferable to incorporate the oxidizer into the chemical mechanical polishing composition at the point of use.

The chemical mechanical polishing composition of the present invention preferably contains, as an initial component, a polyvinyl alkyl ether. Preferably, the chemical mechanical polishing composition contains, as an initial component, 0.005 to 1 wt % (more preferably 0.005 to 0.1 wt %, most preferably 0.008 to 0.03 wt %) of a polyvinyl alkyl ether. Preferably, the polyvinyl alkyl ether is a polyvinyl $C_{1-4}$ alkyl ether. More preferably, the polyvinyl alkyl ether is selected from the group consisting of polyvinyl methyl ether, polyvinyl ethyl ether and polyvinyl propyl ether. Still more preferably, the polyvinyl alkyl ether is selected from the group consisting of polyvinyl methyl ether and polyvinyl ethyl ether. Most preferably, the polyvinyl alkyl ether is polyvinyl methyl ether.

The chemical mechanical polishing composition of the present invention optionally contains, as an initial component, a biocide, such as, for example, a thiazoline derivative. Preferred thiazoline derivative biocides include Kordek™ MLX (9.5-9.9% methyl-4-isothiazolin-3-one, 89.1-9.5% water and ≤1.0% related reaction product) and Kathon™ ICP III containing active ingredients of 2-methyl-4-isothiazolin-3-one and 5-chloro-2-methyl-4-isothiazolin-3-one, each manufactured by Rohm and Haas Company, (Kathon™ and Kordek™ are trademarks of Rohm and Haas Company). Preferably, the chemical mechanical polishing composition contains, as an initial component, 0 to 0.01 wt % (more preferably 0.0001 to 0.01 wt %; most preferably 0.001 to 0.009 wt %) of a biocide.

The chemical mechanical polishing composition of the present invention preferably exhibits a pH of 8 to 12 (more preferably 9 to 11, still more preferably 10 to 11, most preferably 10 to 10.5) at the point of use. Acids suitable for use adjusting the pH of the chemical mechanical polishing composition of the present invention include, for example, nitric acid, sulfuric acid and hydrochloric acid. Bases suitable for use adjusting the pH of the chemical mechanical polishing composition of the present invention include, for example, ammonium hydroxide, magnesium hydroxide, lithium hydroxide and potassium hydroxide.

The water contained in the chemical mechanical polishing composition of the present invention is preferably at least one of deionized and distilled to limit incidental impurities.

The chemical mechanical polishing composition of the present invention preferably contains <0.01 ppm of an organic ammonium cationic salt formed with compounds to include the structure:

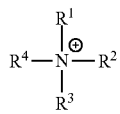

wherein $R^1$, $R^2$, $R^3$ and $R^4$ are radicals; and, wherein $R^1$ has a carbon chain of 2 to 25 carbon atoms. Such organic ammonium cationic salts are known to increase the removal rate of carbon-doped oxides. The addition of compounds, such as organic ammonium cationic salts, to the chemical mechanical polishing composition of the present invention that would increase the removal rate of carbon-doped oxides is to be avoided.

The chemical mechanical polishing composition of the present invention preferably contains <1 ppm of polyvinyl pyrrolidone.

The method for chemical mechanical polishing of a plurality of substrates of the present invention, comprises: providing at least 150 (preferably at least 200, more preferably at least 500, most preferably at least 1,000) separate semiconductor wafer substrates having a surface to be polished, wherein the surface to be polished comprises a low-k dielectric material (preferably, a low-k carbon doped oxide dielectric material having a dielectric constant of ≤3.3 such as, Black Diamond® available from Applied Materials and Coral® available from Novellus Systems); providing a chemical mechanical polishing pad, wherein the chemical mechanical polishing pad comprises a polyurethane; providing a chemical mechanical polishing composition, wherein the chemical mechanical polishing composition consists essentially of, as initial components: water (preferably at least one of distilled water and deionized water); an azole inhibitor; a complexing agent; an ammonium halide; a phosphorus containing agent; a hydrotrope; an abrasive; an oxidizer; a polyvinyl alkyl ether; a biocide; and, a pH adjusting agent; wherein the chemical mechanical polishing composition has a pH of 8 to 12 (preferably a pH of 9 to 11; more preferably a pH of 10 to 11; most preferably a pH of 10 to 10.5); consecutively creating dynamic contact at an interface between the chemical mechanical polishing pad and each one of the at least 150 separate semiconductor wafer substrates; and dispensing the chemical mechanical polishing composition onto the chemical mechanical polishing pad at or near the interface between the chemical mechanical polishing pad and each one of the at least 150 separate semiconductor wafer substrates to facilitate polishing of the surface to be polished of each one of the at least 150 separate semiconductor wafer substrates to provide at least 150 polished wafers; wherein at least some of the low-k dielectric material is removed from the surface to be polished of each one of the at least 150 separate semiconductor wafer substrates to provide the at least 150 polished wafers; wherein the rate at which the low-k dielectric material is removed from the surface to be polished of each one of the at least 150 separate semiconductor wafer substrates to provide the at least 150 polished wafers defines a low-k dielectric material removal rate for each one of the at least 150 polished wafers; wherein the low-k dielectric material removal rates for the at least 150 polished wafers initially decays in magnitude from a first polished wafer in the at least 150 polished wafers to each subsequently polished wafer in the at least 150 polished wafers up until a transition point polished wafer in the at least 150 polished wafers for which the associated low-k dielectric material removal rate is higher than the associated low-k dielectric material removal rate for a last previously polished wafer in the at least 150 polished wafers; wherein the transition point polished wafer is polished before a $100^{th}$ polished wafer in the at least 150 polished wafers is polished; and, wherein the low-k dielectric material removal rates associated with the at least 150 polished wafers remains stable following the polishing of the surface to be polished of a $110^{th}$ polished wafer in the at least 150 polished wafers.

The term "Stable" used herein and in the appended claims in reference to the low-k dielectric material removal rate means that the removal rate of the low-k dielectric material for each semiconductor wafer substrate polished using the method of the present invention subsequent to a $110^{th}$ consecutively polished semiconductor wafer substrate (under the conditions set forth in the Examples) is within 12% (more preferably, within 10%; most preferably, within 7%) of the low-k dielectric material removal rate exhibited for the $110^{th}$ consecutively polishing semiconductor wafer substrate for the remaining life of the provided chemical mechanical polishing pad (preferably at least 1,000 consecutively polished semiconductor wafer substrates).

Preferably, in the method of the present invention the at least 150 (preferably at least 200, more preferably at least 500, most preferably at least 1,000) separate semiconductor wafer substrates provided have a surface to be polished, wherein the surface to be polished comprises a conductive material (preferably copper); an adhesion/barrier material (preferably selected from the group consisting of tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides; more preferably a tantalum nitride); and, a low-k carbon doped oxide dielectric material having a dielectric constant of ≤3.3 (e.g., Black Diamond® available from Applied Materials and Coral® available from Novellus Systems).

The chemical mechanical polishing pad provided in the method of the present invention preferably comprises a polishing layer derived from a curable material. Preferably, the curable material comprises a liquid prepolymer. More preferably, the curable material comprises a liquid prepolymer and a plurality of microelements, wherein the plurality of microelements are uniformly dispersed in the liquid prepolymer.

The liquid prepolymer preferably polymerizes (i.e., cures) to form a material comprising a poly(urethane). The term "poly(urethane)" as used herein and in the appended claims encompasses products derived from the reaction of difunctional or polyfunctional isocyanates (including isocyanate-terminated prepolymers) with compounds containing active-hydrogen groups, including but not limited to polyols, diols, amines, water or combinations thereof. Examples of such reaction products include but are not limited to polyurethanes, polyureas, polyurethaneureas, poyetherurethanes, polyesterurethanes, polyetherureas, polyesterureas, polyisocyanurates, copolymers thereof and mixtures thereof. More preferably, the liquid prepolymer polymerizes to form a material comprising a polyurethane. Most preferably, the liquid prepolymer polymerizes (cures) to form a polyurethane.

Preferably, the liquid prepolymer comprises a polyisocyanate-containing material. More preferably, the liquid prepolymer comprises the reaction product of a polyisocyanate (e.g., diisocyanate) and a hydroxyl-containing material.

Preferably, the polyisocyanate is selected from methylene bis 4,4'-cyclohexyl-isocyanate; cyclohexyl diisocyanate; isophorone diisocyanate; hexamethylene diisocyanate; propylene-1,2-dissocyanate; tetramethylene-1,4-diisocyanate; 1,6-hexamethylene-diisocyanate; dodecane-1,12-diisocyanate; cyclobutane-1,3-diisocyanate; cyclohexane-1,3-diisocyanate; cyclohexane-1,4-diisocyanate; 1-isocyanato-3,3,5-trimethyl-5-isocyanatomethylcyclohexane; methyl cyclohexylene diisocyanate; triisocyanate of hexamethylene diisocyanate; triisocyanate of 2,4,4-trimethyl-1,6-hexane diisocyanate; urtdione of hexamethylene diisocyanate; ethylene diisocyanate; 2,2,4-trimethylhexamethylene diisocyanate; 2,4,4-tri-methylhexamethylene diisocyanate; dicyclohexylmethane diisocyanate; and combinations thereof. Most preferably, the polyisocyanate is aliphatic and has less than 14 percent unreacted isocyanate groups.

Preferably, the hydroxyl-containing material used with the present invention is a polyol. Exemplary polyols include, for example, polyether polyols, hydroxy-terminated polybutadiene (including partially and fully hydrogenated derivatives), polyester polyols, polycaprolactone polyols, polycarbonate polyols, and mixtures thereof.

Preferred polyols include polyether polyols. Examples of polyether polyols include polytetramethylene ether glycol ("PTMEG"), polyethylene propylene glycol, polyoxypropylene glycol, and mixtures thereof. The hydrocarbon chain can have saturated or unsaturated bonds and substituted or unsubstituted aromatic and cyclic groups. Preferably, the polyol of the present invention includes PTMEG. Suitable polyester polyols include, but are not limited to, polyethylene adipate glycol; polybutylene adipate glycol; polyethylene propylene adipate glycol; o-phthalate-1,6-hexanediol; poly(hexamethylene adipate) glycol; and mixtures thereof. The hydrocarbon chain can have saturated or unsaturated bonds, or substituted or unsubstituted aromatic and cyclic groups. Suitable polycaprolactone polyols include, but are not limited to, 1,6-hexanediol-initiated polycaprolactone; diethylene glycol initiated polycaprolactone; trimethylol propane initiated polycaprolactone; neopentyl glycol initiated polycaprolactone; 1,4-butanediol-initiated polycaprolactone; PTMEG-initiated polycaprolactone; and mixtures thereof. The hydrocarbon chain can have saturated or unsaturated bonds, or substituted or unsubstituted aromatic and cyclic groups. Suitable polycarbonates include, but are not limited to, polyphthalate carbonate and poly(hexamethylene carbonate) glycol.

Preferably, the plurality of microelements are selected from entrapped gas bubbles, hollow core polymeric materials (i.e., microspheres), liquid filled hollow core polymeric materials, water soluble materials (e.g., cyclodextrin) and an insoluble phase material (e.g., mineral oil). Preferably, the plurality of microelements are microspheres, such as, polyvinyl alcohols, pectin, polyvinyl pyrrolidone, polyacrylonitrile, poly(vinylidene dichloride), hydroxyethylcellulose, methylcellulose, hydropropylmethylcellulose, carboxymethylcellulose, hydroxypropylcellulose, polyacrylic acids, polyacrylamides, polyethylene glycols, polyhydroxyetheracrylites, starches, maleic acid copolymers, polyethylene oxide, polyurethanes, cyclodextrin and combinations thereof (e.g., Expancel™ from Akzo Nobel of Sundsvall, Sweden). The microspheres can be chemically modified to change the solubility, swelling and other properties by branching, blocking, and crosslinking, for example. Preferably, the microspheres have a mean diameter that is less than 150 μm, and more preferably a mean diameter of less than 50 μm. Most Preferably, the microspheres 48 have a mean diameter that is less than 15 μm. Note, the mean diameter of the microspheres can be varied and different sizes or mixtures of different microspheres 48 can be used. A most preferred material for the microspheres is a copolymer of acrylonitrile and vinylidene dichloride (e.g., Expancel® available from Akzo Nobel).

The liquid prepolymer optionally further comprises a curing agent. Preferred curing agents include diamines. Suitable polydiamines include both primary and secondary amines. Preferred polydiamines include, but are not limited to, diethyl toluene diamine ("DETDA"); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene; 4,4'-methylene-bis-(2-chloroaniline); 4,4'-methylene-bis-(3-chloro-2,6-diethylaniline) ("MCDEA"); polytetramethyleneoxide-di-p-aminobenzoate; N,N'-dialkyldiamino diphenyl methane; p,p'-methylene dianiline ("MDA"); m-phenylenediamine ("MPDA"); methylene-bis 2-chloroaniline ("MBOCA"); 4,4'-methylene-bis-(2-chloroaniline) ("MOCA"); 4,4'-methylene-bis-(2,6-diethylaniline) ("MDEA"); 4,4'-methylene-bis-(2,3-dichloroaniline) ("MDCA"); 4,4'-diamino-3,3'-diethyl-5,5'-dimethyl diphenylmethane, 2,2',3,3'-tetrachloro diamino diphenylmethane; trimethylene glycol di-p-aminobenzoate; and mixtures thereof. Preferably, the diamine curing agent is selected from 3,5-dimethylthio-2,4-toluenediamine and isomers thereof.

Curing agents can also include diols, triols, tetraols and hydroxy-terminated curatives. Suitable diols, triols, and tetraol groups include ethylene glycol; diethylene glycol; polyethylene glycol; propylene glycol; polypropylene glycol; lower molecular weight polytetramethylene ether glycol; 1,3-bis(2-hydroxyethoxy)benzene; 1,3-bis-[2-(2-hydroxyethoxy)ethoxy]benzene; 1,3-bis-{2-[2-(2-hydroxyethoxy)ethoxy]ethoxy}benzene; 1,4-butanediol; 1,5-pentanediol; 1,6-hexanediol; resorcinol-di-(beta-hydroxyethyl)ether;

hydroquinone-di-(beta-hydroxyethyl)ether; and mixtures thereof. Preferred hydroxy-terminated curatives include 1,3-bis(2-hydroxyethoxy)benzene; 1,3-bis-[2-(2-hydroxyethoxy)ethoxy]benzene; 1,3-bis-{2-[2-(2-hydroxyethoxy)ethoxy]ethoxy}benzene; 1,4-butanediol; and mixtures thereof. The hydroxy-terminated and diamine curatives can include one or more saturated, unsaturated, aromatic, and cyclic groups. Additionally, the hydroxy-terminated and diamine curatives can include one or more halogen groups.

Some embodiments of the present invention will now be described in detail in the following Examples.

Comparative Examples C1-C3 and Example 1

Chemical Mechanical Polishing Composition Preparation

The chemical mechanical polishing compositions used in the Comparative Polishing Examples PC1-PC3 and Polishing Example 1 (namely chemical mechanical polishing compositions C1-C3 and 1, respectively) were prepared by combining the components in the amounts listed in Table 1 with the balance being deionized water and adjusting the pH of the compositions to the final pH listed in Table 1 with potassium hydroxide.

TABLE 1

| Ingredient | C1 | C2 | C3 | 1 |
|---|---|---|---|---|
| Benzotriazole | 0.03 wt % | 0.03 wt % | 0.03 wt % | 0.03 wt % |
| Citric acid | 0.304 wt % | 0.304 wt % | 0.304 wt % | 0.304 wt % |
| Ammonium chloride | 0.02 wt % | 0.02 wt % | 0.02 wt % | 0.02 wt % |
| Kordek ™ MLX* | 0.005 wt % | 0.005 wt % | 0.005 wt % | 0.005 wt % |
| Phosphoric acid | 0.08615 wt % | 0.08615 wt % | 0.08615 wt % | 0.08615 wt % |
| Potassium hydroxide | 0.3797 wt % | 0.3797 wt % | 0.3797 wt % | 0.3797 wt % |
| Abrasive‡ | 25.0 wt % | 25.0 wt % | 25.0 wt % | 25.0 wt % |
| Polyvinyl methyl ether | — | 0.01 wt % | 0.01 wt % | 0.01 wt % |
| Hydrotrope¥ | — | — | — | 0.5 wt % |
| Surfactant⁂ | — | 0.8 wt % | — | — |
| pH | 10.4 | 10.4 | 10.4 | 10.4 |

*Kordek ™ MLX is a mixture of 9.5-9.9% methyl-4-isothiazolin-3-one, 89.1-9.5% water and ≤1.0% related reaction product available from Rohm and Haas Company.

‡Klebosol ™ 1501-50 slurry manufactured by AZ Electronic Materials, available from Rohm and Haas Electronic Materials CMP Inc.

⁂Cetyl trimethyl ammonium bromide.

Comparative Examples PC1-PC3 and Example P1

Chemical Mechanical Polishing Experiments

Coral® blanket wafer removal rate polishing tests were performed using the chemical mechanical polishing compositions prepared according to Comparative Examples C1-C3 and Example 1. Specifically, multiple dummy wafers were provided with Coral® blanket wafers mixed in as the $10^{th}$, $25^{th}$, $50^{th}$, $75^{th}$, $100^{th}$, etc. wafer. These wafers were then consecutively polished and the Coral® removal rates were measured for each of the chemical mechanical polishing compositions C1-C3 and 1 as identified in Table 1. An Applied Materials, Inc. Reflexion 300 mm polishing machine equipped with an ISRM detector system using a VisionPad™ 3100 polyurethane polishing pad with a 1010+A24 groove pattern (commercially available from Rohm and Haas Electronic Materials CMP Inc.) under down force conditions of 1.5 psi (10.3 kPa), a polishing solution flow rate of 350 cc/min, a platen speed of 93 RPM, and a carrier speed of 87 RPM. A Diagrid® AD3BS-211250-3FN diamond pad conditioner (commercially available from Kinik Company) was used to condition the polishing pad between wafers. The Coral® removal rates were determined using a KLA Tencor ASET F5X metrology tool. The results of the removal rate experiments for consecutively numbered wafers are provided in Table 2.

TABLE 2

| Slurry Composition | Coral ® removal rate (Å/min) for consecutive Wafer # | | | | | | | | | |
|---|---|---|---|---|---|---|---|---|---|---|
| | 10 | 25 | 50 | 75 | 100 | 110 | 125 | 150 | 175 | 200 |
| C1 | 3212 | 3166 | 3194 | 3197 | 3236 | — | — | — | — | — |
| C2 | 2631 | 2619 | 2409 | 2397 | 2429 | — | — | — | — | — |
| C3 | 1502 | 888 | 702 | 650 | 535 | — | — | — | — | — |
| 1 | 1197 | 504 | 479 | 491 | — | 849 | 878 | 796 | 825 | 813 |

We claim:

1. A chemical mechanical polishing composition, consisting essentially of, as initial components:
   water;
   0.01 to 0.5 wt % of an azole inhibitor, wherein the azole inhibitor is selected from the group consisting of benzotriazole (BTA), mercaptobenzotriazole (MBT), tolytriazole (TTA), imidazole and combinations thereof;
   0.01 to 0.5 wt % of a complexing agent, wherein the complexing agent is selected from the group consisting of citric acid, lactic acid, malic acid, maleic acid, malonic acid, oxalic acid, tartaric acid and gluconic acid;
   0 to 1.0 wt % of an ammonium halide, wherein the ammonium halide is selected from the group consisting of ammonium chloride, ammonium bromide and ammonium fluoride;
   0.01 to 1 wt % of a phosphorus containing agent, wherein the phosphorus containing agent is phosphoric acid;
   0.05 to 1.0 wt % of a hydrotrope, wherein the hydrotrope is selected from the group consisting of benzene sulfonate, $C_{1-4}$ alkylbenzene sulfonates, di-$C_{1-4}$ alkylbenzene sulfonates, $C_{5-10}$ alkane sulfonate and salts thereof;
   0.1 to 40 wt % of a colloidal silica abrasive;
   0 to 5.0 wt % of an oxidizer;
   0.005 to 1.0 wt % of a polyvinyl alkyl ether;
   0 to 0.01 wt % of a biocide, wherein the biocide is a thiazoline derivative; and,
   a pH adjusting agent;
   wherein the chemical mechanical polishing composition has a designed for polishing pH of 8 to 12; and,
   wherein the chemical mechanical polishing composition exhibits a stable manufacturing low-k dielectric material removal rate.

2. The chemical mechanical polishing composition of claim 1,
wherein the colloidal silica abrasive has an average particle size of ≤100 nm; and,
wherein the oxidizer is selected from hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof.

3. The chemical mechanical polishing composition of claim 2, wherein the chemical mechanical polishing composition consists essentially of, as an initial component:
0.01 to 1.0 wt % of the ammonium halide; and,
0.0001 to 0.01 wt % of the biocide.

4. The chemical mechanical polishing composition of claim 3, wherein the chemical mechanical polishing composition consists essentially of, as initial components:
water;
0.02 to 0.04 wt % of the azole inhibitor;
0.1 to 0.4 wt % of the complexing agent;
0.1 to 0.3 wt % of the ammonium halide;
0.05 to 0.1 wt % of the phosphorus containing agent;
0.3 to 0.8 wt % of the hydrotrope;
20 to 30 wt % of the colloidal silica abrasive;
0.1 to 0.5 wt % of the oxidizer;
0.008 to 0.03 wt % of the polyvinyl alkyl ether; and,
0.001 to 0.009 wt % of the biocide.

5. The chemical mechanical polishing composition of claim 3, wherein the chemical mechanical polishing composition consists essentially of, as initial components:
water;
0.02 to 0.04 wt % of the azole inhibitor, wherein the azole inhibitor is benzotriazole;
0.1 to 0.4 wt % of the complexing agent, wherein the complexing agent is citric acid;
0.1 to 0.3 wt % of the ammonium halide, wherein the ammonium halide is ammonium chloride;
0.05 to 0.1 wt % of the phosphorus containing agent, wherein the phosphorus containing agent is phosphoric acid;
0.3 to 0.8 wt % of the hydrotrope, wherein the hydrotrope is according to the following formula:

$$H_3C-(CH_2)_7-SO_3Na;$$

20 to 30 wt % of the colloidal silica abrasive, wherein the colloidal silica has an average particle size of ≤100 nm;
0.1 to 0.5 wt % of the oxidizer, wherein the oxidizer is $H_2O_2$;
0.008 to 0.03 wt % of the polyvinyl alkyl ether; and,
0.001 to 0.009 wt % of the biocide.

6. A method for chemical mechanical polishing of a plurality of substrates, comprising:
providing at least 150 separate semiconductor wafer substrates having a surface to be polished, wherein the surface to be polished comprises a low-k dielectric material;
providing a chemical mechanical polishing pad, wherein the chemical mechanical polishing pad comprises a polyurethane;
providing a chemical mechanical polishing composition, wherein the chemical mechanical polishing composition consists essentially of, as initial components:
water;
0.01 to 0.5 wt % of the azole inhibitor, wherein the azole inhibitor is selected from the group consisting of benzotriazole (BTA), mercaptobenzotriazole (MBT), tolytriazole (TTA), imidazole and combinations thereof;
0.01 to 0.5 wt % of the complexing agent, wherein the complexing agent is selected from the group consisting of citric acid, lactic acid, malic acid, maleic acid, malonic acid, oxalic acid, tartaric acid and gluconic acid;
0 to 1.0 wt % of the ammonium halide, wherein the ammonium halide is selected from the group consisting of ammonium chloride, ammonium bromide and ammonium fluoride;
0.01 to 1 wt % of the phosphorus containing agent, wherein the phosphorus containing agent is phosphoric acid;
0.05 to 1.0 wt % of the hydrotrope, wherein the hydrotrope is selected from the group consisting of benzene sulfonate, $C_{1-4}$ alkylbenzene sulfonates, di-$C_{1-4}$ alkylbenzene sulfonates, $C_{5-10}$ alkane sulfonate and salts thereof;
0.1 to 40 wt % of the colloidal silica abrasive;
0 to 5.0 wt % of the oxidizer;
0.005 to 1.0 wt % of the polyvinyl alkyl ether;
0 to 0.01 wt % of the biocide, wherein the biocide is a thiazoline derivative; and,
a pH adjusting agent;
wherein the chemical mechanical polishing composition has a pH of 8 to 12;
consecutively creating dynamic contact at an interface between the chemical mechanical polishing pad and each one of the at least 150 separate semiconductor wafer substrates; and
dispensing the chemical mechanical polishing composition onto the chemical mechanical polishing pad at or near the interface between the chemical mechanical polishing pad and each one of the at least 150 separate semiconductor wafer substrates to facilitate polishing of the surface to be polished of each one of the at least 150 separate semiconductor wafer substrates to provide at least 150 polished wafers;
wherein at least some of the low-k dielectric material is removed from the surface to be polished of each one of the at least 150 separate semiconductor wafer substrates to provide the at least 150 polished wafers;
wherein the rate at which the low-k dielectric material is removed from the surface to be polished of each one of the at least 150 separate semiconductor wafer substrates to provide the at least 150 polished wafers defines a low-k dielectric material removal rate for each one of the at least 150 polished wafers;
wherein the low-k dielectric material removal rates for the at least 150 polished wafers initially decays in magnitude from a first polished wafer in the at least 150 polished wafers to each subsequently polished wafer in the at least 150 polished wafers up until a transition point polished wafer in the at least 150 polished wafers for which the associated low-k dielectric material removal rate is higher than the associated low-k dielectric material removal rate for a last previously polished wafer in the at least 150 polished wafers;
wherein the transition point polished wafer is polished before a $100^{th}$ polished wafer in the at least 150 polished wafers is polished; and,
wherein the low-k dielectric material removal rates associated with the at least 150 polished wafers remains stable following the polishing of the surface to be polished of a 110$^{th}$ polished wafer in the at least 150 polished wafers.

7. The method of claim 6,
wherein the colloidal silica abrasive has an average particle size of ≤100 nm; and,
wherein the oxidizer is selected from hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof.

8. The method of claim 7, wherein the chemical mechanical polishing composition provided consists essentially of, as an initial component:
0.01 to 1.0 wt % of the ammonium halide; and,
0.0001 to 0.01 wt % of the biocide.

9. The method of claim 8, wherein the chemical mechanical polishing composition provided consists essentially of, as initial components:
water;
0.02 to 0.04 wt % of the azole inhibitor;
0.1 to 0.4 wt % of the complexing agent;
0.1 to 0.3 wt % of the ammonium halide;
0.05 to 0.1 wt % of the phosphorus containing agent;
0.3 to 0.8 wt % of the hydrotrope;
20 to 30 wt % of the colloidal silica abrasive;
0.1 to 0.5 wt % of the oxidizer;
0.008 to 0.03 wt % of the polyvinyl alkyl ether; and,
0.001 to 0.009 wt % of the biocide.

\* \* \* \* \*